United States Patent [19]

Hayakawa et al.

[11] Patent Number: 4,745,612
[45] Date of Patent: May 17, 1988

[54] SEPARATE CONFINEMENT HETEROSTRUCTURE SEMICONDUCTOR LASER DEVICE

[75] Inventors: Toshiro Hayakawa, Nara; Takahiro Suyama, Tenri; Kohsei Takahashi; Masafumi Kondo, both of Tenri; Saburo Yamamoto, Nara, all of Japan

[73] Assignee: Sharp Kabushiki Kaisha, Osaka, Japan

[21] Appl. No.: 884,554

[22] Filed: Jul. 11, 1986

[30] Foreign Application Priority Data

Jul. 16, 1985 [JP] Japan .................................. 60-159148

[51] Int. Cl.$^4$ .............................................. H01S 3/19
[52] U.S. Cl. ........................................ 372/45; 372/44; 357/16; 357/17; 357/90
[58] Field of Search ............... 372/44, 45; 357/16, 357/17, 90

[56] References Cited

U.S. PATENT DOCUMENTS

| 4,512,022 | 4/1985 | Tsang | 372/45 |
| 4,644,378 | 2/1987 | Williams | 372/45 |
| 4,671,830 | 6/1987 | Burnham | 372/45 |

FOREIGN PATENT DOCUMENTS 2099624  12/1982  United Kingdom ................. 372/45

OTHER PUBLICATIONS

T. Hayakawa et al., Journal of Applied Physics, vol. 54, May 1983, pp. 2209-2213.
S. Yamamoto et al., Appl. Phys. Lett., vol. 41:796-798.
T. Fujii et al., Extended Abstracts of the 16th Conference on Solid State Devices and Materials.

*Primary Examiner*—James W. Davie
*Assistant Examiner*—Xuan Vo
*Attorney, Agent, or Firm*—Ciotti & Murashige, Irell & Manella

[57] ABSTRACT

The laser device has an $Al_xGa_{1-x}As$ ($x \geqq 0.3$) quantum well active region having a thickness of 200 angstroms or less. $Al_yGa_{1-y}As$ ($y > x$) carrier supplying layers sandwich the quantum well active region therebetween. An $Al_zGa_{1-z}As$ ($z > y$) cladding layer is disposed on each of the carrier supplying layers. Finally an $Al_wGa_{1-w}As$ ($w > z$) barrier layer is disposed between each of the carrier supplying layers and each of the cladding layers.

7 Claims, 2 Drawing Sheets

SEPARATE CONFINEMENT HETEROSTRUCTURE SEMICONDUCTOR LASER DEVICE

BACKGROUND OF THE INVENTION

1. Field of the Invention

This invention relates to a semiconductor laser device attaining laser oscillation at a low threshold, said laser device containing a quantum well as an active layer formed by molecular beam epitaxy (MBE), metal-organic chemical vapor deposition (MOCVD), etc., and having an oscillation wavelength in the visible region of 700 nm or less.

2. Description of the Prior Art

With the development of optical information processors such as optical discs, and laser printers utilizing semiconductor laser devices as a signal light source, semiconductor laser devices are required to produce laser light having a short wavelength. $Ga_{1-x}Al_xAs$ semiconductor laser devices have been developed for this purpose. Especially, $Ga_{1-x}Al_xAs$ semiconductor laser devices attaining laser oscillation in the 780 nm region work at room temperature for $10^6$ hours or more, and are widely used as light sources for compact discs.

However, the $Ga_{1-x}Al_xAs$ semiconductors crystal tends to transform from a direct transition crystal into an indirect transition crystal as the AlAs mole fraction x in the $Ga_{1-x}Al_xAs$ crystal is increased. Thus, in conventional double-heterostructure semiconductor laser devices in which a $Ga_{1-x}Al_xAs$ crystal is used for the active layer, when the AlAs mole fraction x is 0.2 or more (i.e., $x \geq 0.2$) and the oscillation wavelength is 750 nm or less, the internal efficiency of the devices decreases, causing an increase in the threshold current level, as disclosed by T. Hayakawa et al., Journal of Applied Physics vol. 54, p. 2209 (1983).

For this reason, the oscillation wavelength, at which conventional double-heterostructure semiconductor laser devices continuously oscillate laser light at room temperature, is 683 nm at their shortest (S. Yamamoto et al., Appl. Phys. Lett. vol. 41, p. 796 (1982)).

Moreover, conventional GRIN-SCH (graded-index separate confinement heterostructure) lasers having a GaAs quantum well with a thickness of 200 Å or less attain laser oscillation with a threshold current density of as low as 200 A/cm² or less at a wavelength in the infrared zone of around 800 nm (T. Fujii et al., Extended Abstracts of the 16th Conference on Solid State Devices and Materials p. 145 (1984)).

FIG. 4 shows the distribution of the AlAs mole fraction x a $Ga_{1-x}Al_xAs$ mixed crystal of the GRIN-SCH lasers, indicating that, for example, when the AlAs mole fraction x in the $Ga_{1-x}Al_xAs$ mixed crystal for the quantum well is zero (i.e., the GaAs crystal is used for the quantum well), and when the AlAs mole fraction y in the $Ga_{1-y}Al_yAs$ barrier layer is 0.2 (i.e., the $GA_{0-8}Al_{0-2}As$ crystal is used for the barrier layer), and moreover when the AlAs mole fraction z in the $Ga_{1-z}Al_zAs$ cladding layer is 0.5 (i.e., the $Ga_{0.5}Al_{0.5}As$ crystal is used for the cladding layer), then the quantum well can be provided with an energy barrier which is sufficiently high corresponding to the difference between y and x (i.e., $y-x=0.2$), and leakage of carrier from the GRIN region to the cladding layer adjacent to the GRIN region can be prevented corresponding to the difference between z and y (i.e., $z-y=0.3$), and moreover the AlAs mole fraction gradient in the GRIN region having various AlAs mole fractions therein can be set at a high level to thereby effectively lead carrier into the quantum well and effectively converge light into the quantum well.

Semiconductor laser devices oscillating visible light having an oscillation wavelength of 700 nm or less can be produced, using such a conventional GRIN-SCH structure, when, for example, $x=0.3$, $y=0.5$ and $z=0.8$. However, the AlGaAs crystal is converted from a direct transition type into an indirect transition type when the AlAs mole fraction therein becomes 0.45 or more, and an increasing rate of its energy gap decreases with an increase in the AlAs mole fraction therein, compared with the case in which the AlAs mole fraction is 0.45 or less, which causes difficulty in creating a great energy gap. For example, when $y=0.2$ and $z=0.5$, the difference in energy gap between the cladding layer and the barrier is 325 meV, while when $y=0.5$ and $z=0.8$, the difference in energy gap therebetween is as small as 93 meV so that it is difficult to effectively lead carrier into the quantum well and leakage of carrier to the cladding layer cannot be prevented, resulting in an increase in the threshold current.

SUMMARY OF THE INVENTION

The semiconductor laser device of this invention, which overcomes the above-discussed and numerous other disadvantages and deficiencies of the prior art, comprises an $Al_xGa_{1-x}As$ ($x \geq 0.3$) quantum well active region having a thickness of 200 Å or less, $Al_yGa_{1-y}As$ ($y>x$) carrier supplying layers sandwiching said quantum well active region therebetween, and an $Al_zGa_{1-z}As$ ($z>y$) cladding layer disposed on each of said carrier supplying layers, wherein an $Al_wGa_{1-w}As$ ($w>z$) barrier layer is disposed between each of said carrier supplying layers and each of said cladding layers.

The quantum well active region is, in a preferred embodiment, an $Al_xGa_{1-x}As$ single quantum well layer.

Alternatively, the quantum well active region is, in a preferred embodiment, a multi-layered quantum well which is composed of alternate layers consisting of AlGaAs quantum wells and AlGaAs barrier layers.

Thus, the invention described herein makes possible the object of producing a semiconductor laser device which attains an effective use of the carrier although the semiconductor mixed crystal is converted from a direct transition type into an indirect transition type in the region where the AlAs mole fraction in the mixed crystal is high, thereby oscillating with a low wavelength, 700 nm or less, at a low threshold current level.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The semiconductor laser device of this invention is designed to be provided with a barrier layer having an AlAs mole fraction higher than the cladding layer adjacent to the barrier layer in such a manner that said barrier layer is disposed between the cladding layer and the carrier supplying region (or the GRIN region), so that leakage of carrier from the GRIN region to the cladding layer can be suppressed and the energy gradient in the GRIN region can be set at a high level, thereby effectively leading carrier into the quantum well, resulting in the lowering of the threshold current level.

EXAMPLE 1

Figure 1:
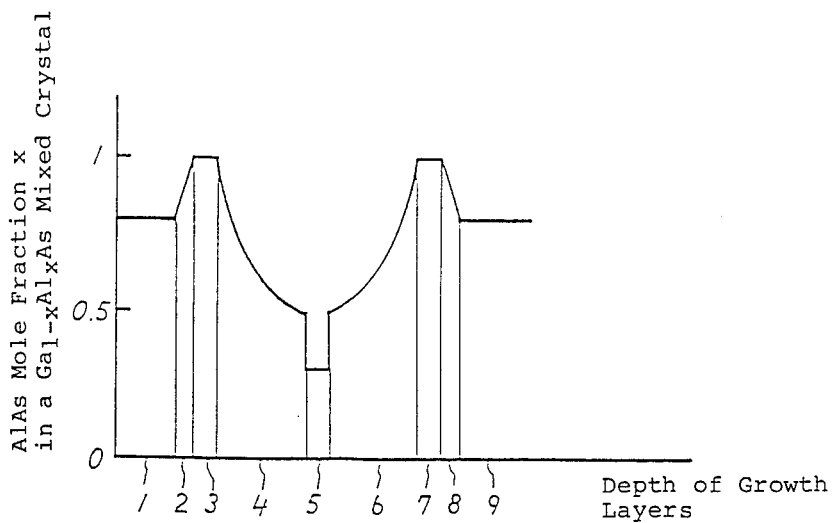
FIG. 1 is a diagram showing the distribution of the AlAs mole fraction (i.e., x) in the section of a $Ga_{1-x}Al_xAs$ semiconductor laser device of this invention.
Figure 2:
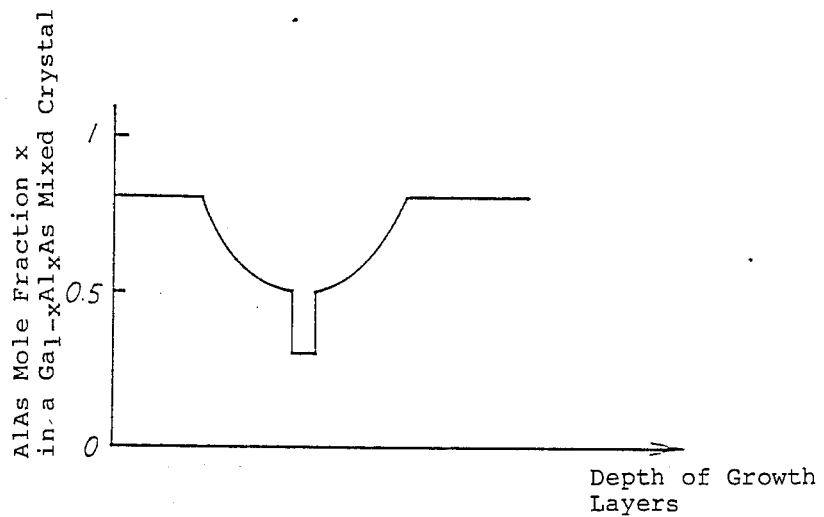
FIG. 2 is a diagram showing the distribution of the AlAs mole fraction (i.e., x) in the section of a reference $Ga_{1-x}Al_xAs$ GRIN-SCH semiconductor laser device which was produced to compare with the semiconductor laser device shown in FIG. 1.

FIG. 1 shows the distribution of the AlAs mole fraction x in a $Ga_{1-x}Al_xAs$ mixed crystal in the section of a GRIN-SCH semiconductor laser device of this invention, wherein the ordinate is the AlAs mole fraction of 1 and the GaAs mole fraction of 0 and the abscissa is the depth of multi-crystal layers grown on the substrate. The abscissa indicates a variation in the AlAs mole fraction x in each layer, but it does not indicate the actual thickness of each layer. This semiconductor laser device is produced as follows: On an n-GaAs substrate, an n-$Al_{0.8}Ga_{0.2}As$ cladding layer 1 having a thickness of 1 μm, an n-$Al_xGa_{1-x}As$ band connecting layer 2 having a thickness of 100 Å (wherein x is linearly changed from 0.8 to 1.0), and n-AlAs barrier layer 3 having a thickness of 100 Å, a nondoped $Al_xGa_{1-x}As$ GRIN layer 4 having a thickness of 2000 Å (wherein x is changed parabolically from 1 to 0.5), a non-doped $Al_{0.3}Ga_{0.7}As$ quantum well layer 5 having a thickness of 70 Å, a non-doped $Al_xGa_{1-x}As$ GRIN layer 6 having a thickness of 2000 Å (wherein x is changed parabolically from 0.5 to 1), a p-AlAs barrier layer 7 having a thickness of 100 Å, a p-$Al_xGa_{1-x}As$ band connecting layer 8 having a thickness of 100 Å, a p-$Al_{0.8}Ga_{0.2}As$ cladding layer 9 having a thickness of 1 μm, and a p-GaAs cap layer are successively formed by molecular beam epitaxy. The reference numerals indicated by the abscissa shown in FIG. 1 correspond to the above-mentioned reference numerals of the growth layers. The resulting wafer is then cleaved to form a broad area laser having an internal cavity length of 250 μm and a width of 100 μm, which oscillated with an oscillation wavelength of 660 nm at a threshold current density of 1 KA/cm².

In order to compare the above-mentioned GRINSCH semiconductor laser device of this invention shown in FIG. 1 with a conventional GRIN-SCH semiconductor laser device, a reference GRIN-SCH semiconductor laser device was produced which is provided with the same cladding layers and the same quantum well layer as the above-mentioned GRIN-SCH semiconductor laser device of this invention, but which is not provided with any barrier layer, and which is provided with $Al_xGa_{1-x}As$ GRIN layers having a thickness of 2000 Å wherein x is changed parabolically from 0.8 to 0.5. This reference semiconductor laser device oscillated with an oscillation wavelength of 660 nm at a threshold current density of 10 KA/cm², which is as high as ten times that of the device of this invention.

As mentioned above, the threshold at laser oscillation of the semiconductor laser device of this invention can be effectively lowered by the barrier layers even when the oscillation wavelength is as low as 660 nm. The reason such an excellent effect can be attained is as follows: The barrier layer, which has an energy gap greater than the cladding layer and the GRIN layer, and which s disposed between the cladding layer and the GRIN layer, prevent carrier from leaking from the GRIN layer to the cladding layer. moreover, the AlAs mole fraction in the GRIN layer is set at a high level, resulting in a great energy gradient thereof so that carrier can be effectively led into the quantum well. In addition, the distribution of a high refractive index can be attained, causing an increase in the photon density within the quantum well.

In a semiconductor laser device having an $Al_xGa_{1-x}As$ quantum well (x<0.3), e.g., a GaAs quantum well, when the GRIN layer is composed of an $Al_xGa_{1-x}As$ mixed crystal (wherein x is changed parabolically from 0.2 to 0.8) and the cladding layer is composed of an $Al_{0.8}Ga_{0.2}As$ mixed crystal, a barrier having a sufficiently high energy gap can be formed and moreover either the energy gradient or the refractive index variation in the GRIN layer can be set at a high level.

On the other hand, in a semiconductor laser device having an $Al_xGa_{1-x}As$ quantum well (x≧0.3), the AlAs mole fraction in each of the growth layers can be set at a large value, but the cladding layer must be of an AlAs crystal. The AlAs crystal is an unstable substance to be readily oxidized, so that the use of a thick AlAs layer for the semiconductor laser device should cause problems of life and/or reliability of the device. According to this invention, the cladding layer has a minimum AlAs mole fraction, but it still has an excellent characteristic equivalent to that of an AlAs cladding layer.

The band connecting layers 2 and 8, which have an AlAs mole fraction linearly changed, function to smoothly connect the energy bands, but they are not essential to the semiconductor laser device of this invention.

EXAMPLE 2

Figure 3:
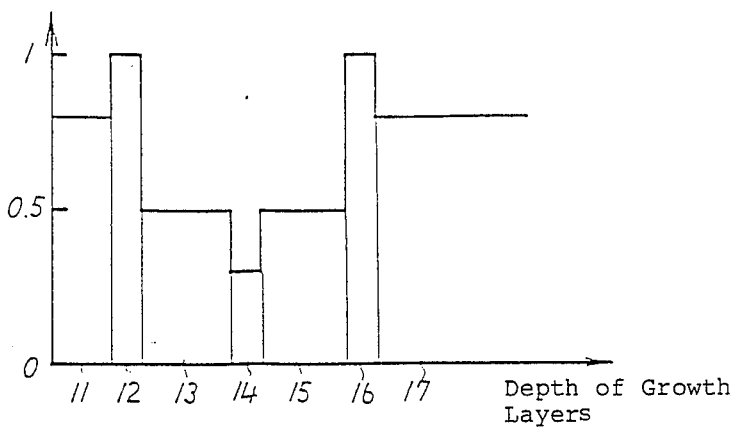
FIG. 3 is a diagram showing the distribution of the AlAs mole fraction (i.e., x) in the section of another $Ga_{1-x}Al_xAs$ semiconductor laser device of this invention.
Figure 4:
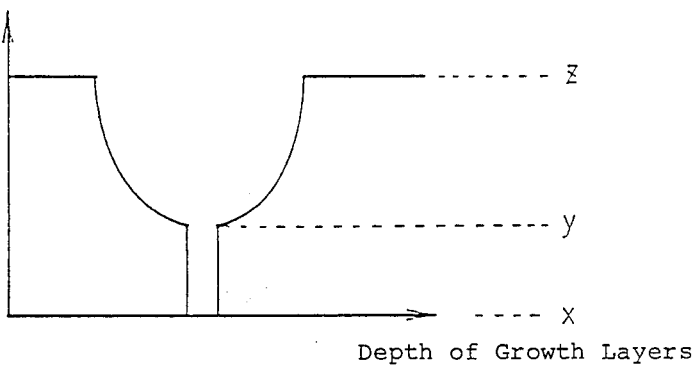
FIG. 4 is a diagram showing the distribution of the AlAs mole fraction (i.e., x) in the section of a conventional $Ga_{1-x}Al_xAs$ GRIN-SCH semiconductor laser device.

This invention is not limited to the GRIN-SCH semiconductor laser device disclosed in the above-mentioned example, but it is applicable to a common SCH semiconductor laser device, in which, for example, as shown in FIG. 3, barrier layers 12 and 16 must be disposed between the carrier supplying layer 13 and the cladding layer 11 and between the carrier supplying layer 15 and the cladding layer 17, respectively.

Although an $Al_{0.3}Ga_{0.7}As$ single quantum well is only disclosed in the above-mentioned two examples, a multi-layered quantum well which is composed of alternate layers consisting of, for example, $Al_{0.3}Ga_{0.7}As$ quantum wells and $Al_{0.5}Ga_{0.5}As$ barrier layers can be employed.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device the combination comprising:
a substrate;
a first electrode formed under said substrate;
a multilayer construction formed on said substrate; and
a second electrode formed on said multilayer construction,
said multilayer construction comprising at least the following in sequence:
a first $Al_zGa_{1-z}As$ ($z>y$) cladding layer;
a first $Al_wGa_{1-w}As$ ($w>z$) barrier layer;
a first $Al_yGa_{1-y}As$ ($y>x$) carrier supplying layer;
an $Al_xGa_{1-x}As$ ($x \geq 0.3$) quantum well active region having a thickness of 200 angstroms or less;
a second carrier supplying layer having the same crystal composition as said first carrier supplying layer;
a second barrier layer having the same crystal composition as said first barrier layer; and
a second cladding layer having the same crystal composition as said first cladding layer.

2. A semiconductor laser device according to claim 1, wherein said quantum well active region is an $Al_xGa_{1-x}As$ single quantum well layer.

3. A semiconductor laser device according to claim 1, wherein said quantum well active region is a multilayered quantum well which is composed of alternate layers consisting of AlGaAs quantum wells and third AlGaAs barrier layers.

4. In a semiconductor laser device, the combination comprising:
a substrate;
a first electrode formed under said substrate;
a multilayer construction formed on said substrate; and
a second electrode formed on said multilayer construction,
said multilayer construction comprising at least the following in sequence:
a first $Al_zGa_{1-z}As$ cladding layer;
a first $Al_wGa_{1-w}As$ ($w>z$) barrier layer;
a first $Al_uGa_{1-u}As$ ($w \geq u>x$) carrier supplying layer, u varying from w to a value larger than x along the growth direction;
an $Al_xGa_{1-x}As$ ($x \geq 0.3$) quantum well active region having a thickness of 200 angstroms or less;
a second $Al_vGa_{1-v}As$ ($w \geq v>x$) carrier supplying layer, v varying from a value larger than x to w along the growth direction;
a second barrier layering having the same crystal composition as said first barrier layer; and
a second cladding layer having the same crystal composition as said first cladding layer.

5. A semiconductor laser device according to claim 4, wherein said quantum well active region is an $Al_xGa_{1-x}As$ single quantum well layer.

6. A semiconductor laser device according to claim 4, wherein said quantum well active region is a multilayered quantum well which is composed of alternate layers consisting of AlGaAs quantum wells and third AlGaAs barrier layers.

7. A semiconductor laser device according to claim 4, wherein said multilayer construction further comprises:
a first $Al_sGa_{1-s}As$ band connecting layer disposed between said first cladding layer and said first barrier layer, s varying from z to w along the growth direction; and
a second $Al_tGa_{1-t}As$ band connecting layer disposed between said second barrier layer and said second cladding layer, t varying from w to z along the growth direction.

* * * * *